Sept. 29, 1970 C. YAGHER, JR 3,531,596

TREBLE AND BASS CONTROL CIRCUIT

Filed Jan. 26, 1967

INVENTOR

CHARLES YAGHER, JR.

BY Thomas A. Briody

ATTORNEY

United States Patent Office 3,531,596

Patented Sept. 29, 1970

3,531,596

TREBLE AND BASS CONTROL CIRCUIT

Charles Yagher, Jr., Decatur, Ill., assignor to General Electric Company, a corporation of New York Filed Jan. 26, 1967, Ser. No. 611,992

Int. Cl. H04r 3/04

U.S. Cl. 179—1 2 Claims

ABSTRACT OF THE DISCLOSURE

An audio frequency tone control circuit which includes separate treble and bass control networks and a loudness control. The treble control network comprises a common emitter transistor connected so that all of the voltage at its collector, at midband and treble frequencies, is fed to a shunt circuit that includes a series connected variable resistor and a fixed capacitor. The bass control network includes a pair of capacitors series connected between the collector of the transistor and the input terminal of an amplifier, and a variable resistance connected to shunt one of the capacitors.

Figure 1:
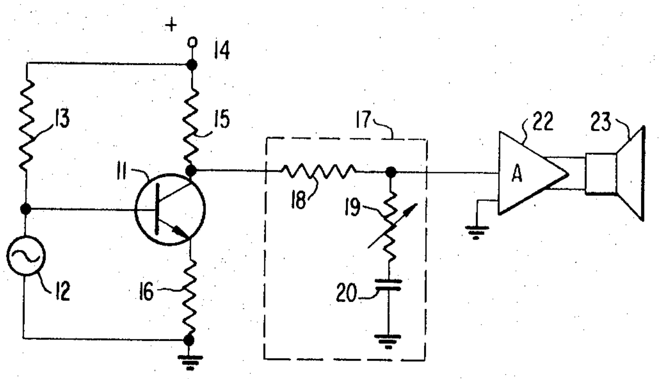
FIG. 1 PRIOR ART

The present invention relates generally to treble control circuits for audio sources and more particularly to a treble controller wherein substantially all of the treble frequency voltage developed at the collector of a transistor is applied across a variable resistor connected in series with a capacitor.

One type of prior art treble control networks is essentially a voltage divider comprised of a resistance connected in series with a source and a shunt circuit including a capacitor and variable resistance. A problem with such circuits is the voltage dividing effect of the series resistance over the entire audio spectrum, whereby the source voltage is invariably decreased prior to being applied to a power amplifier. Decreasing the voltage of a source, such as the output of a tuner or a relatively low level phono pick-up, adversely affects the quality of the signal derived from the power amplifier because low signal-to-noise ratios can be introduced. Signal-to-noise ratio of course, is always a factor which must be considered in low level audio amplifiers responsive to speech and music, because of the ever present effects of stray 60 cycle hum and microphonics. If the noise level even approaches the same order of magnitude as the signal, the output of the power amplifier, as coupled to a speaker system, is intolerable for human listeners. It has been found that the voltage division introduced by the prior art circuit can cause the signal level applied to the input terminals of the power amplifier to be on the same order of magnitude as ambient noise whereby the adverse audio output effects mentioned occur. In addition to the above effects, the series resistor causes greater undesirable reduction in the mid-band and bass frequencies when the treble frequencies are reduced to a minimum by the treble control of the prior art.

According to the present invention, a treble control network is provided that has little effect on the mid-band and bass frequency responses of a preamplifier coupled to the low level outputs of a tuner and/or phono cartridge. The circuit configuration according to the present invention relies upon the principle that the voltage gain of a transistor amplifier is approximately equal to the ratio of the collector to emitter loads. The treble circuit comprises a variable resistance and capacitor connected so that substantially all of the mid-band and treble frequency voltages developed at the transistor collector are applied directly across the treble controller. Since the treble control network is directly responsive to the voltage developed at the collector of the driving transistor, the need for the prior art voltage dividing resistor is obviated. By eliminating the voltage dividing resistor, the signal levels in the mid-band and bass ranges are not reduced by the treble controller and a greater signal-to-noise ratio is derived. Hence, the circuit of the present invention enables improved performance to be obtained with a reduction in components. Of course in commercial audio amplifiers, the reduction of even a single component is highly desirable.

It is, accordingly, an object of the present invention to provide a new and improved treble control network.

Another object of the present invention is to provide a treble control network wherein the bass and mid-range voltages are not appreciably reduced due to components in the treble control network.

A further object of the present invention is to provide a new and improved treble control network that is less expensive than prior art networks because it includes less components, while providing improved performance.

Still another object of the present invention is to provide a treble control network wherein greater signal-to-noise ratio is derived than with certain prior art treble control networks, whereby the adverse effects of noise due to 60 cycle hum and microphonics in the output of a speaker are obviated.

Figures 2A, 3:
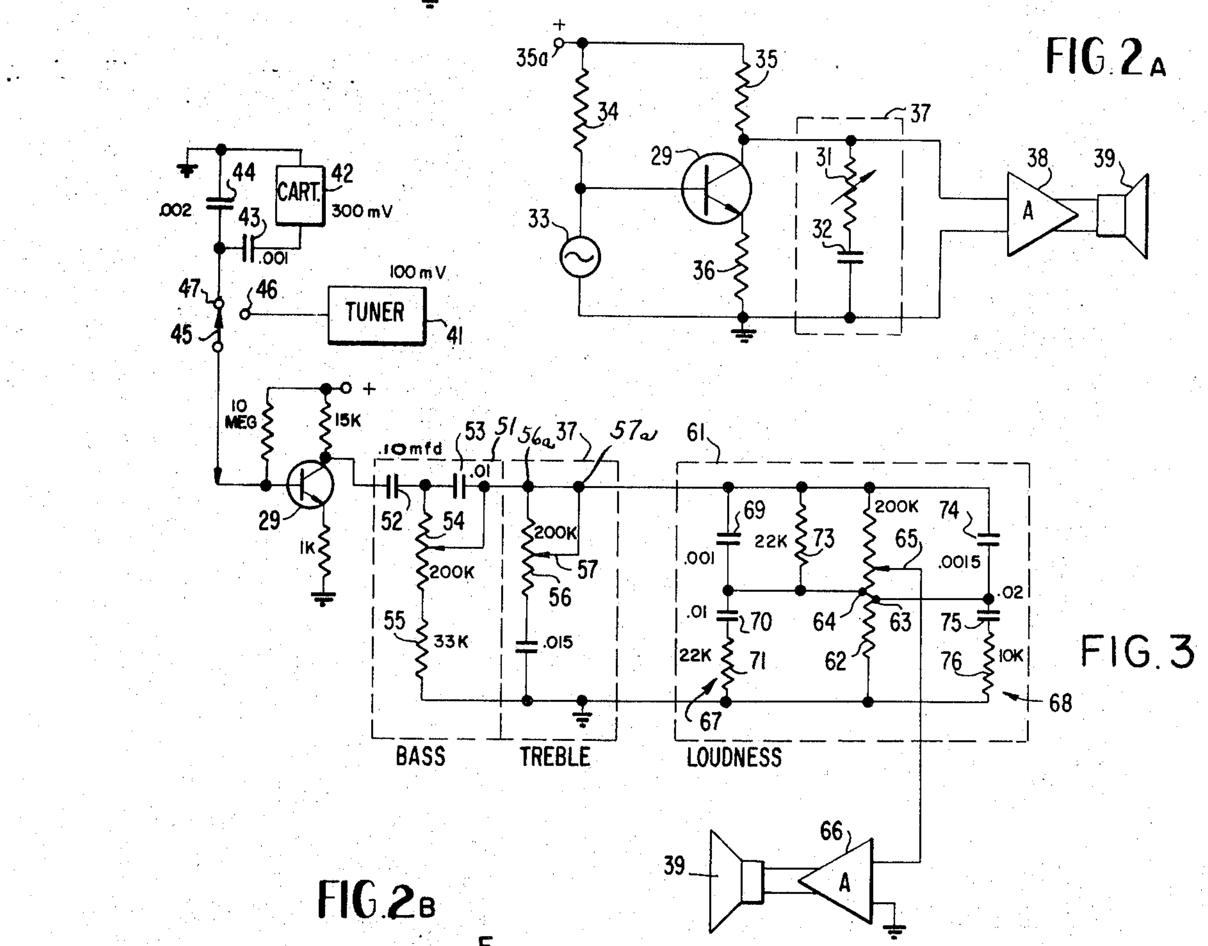
Figure 2B:
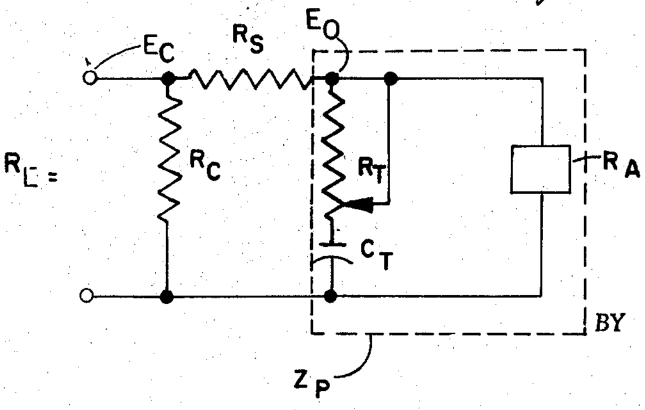

The above and still further objects, features and advantages of the present invention will become apparent upon consideration of the following detailed description of one specific embodiment thereof, especially when taken in conjunction with accompanying drawing, wherein:

FIG. 1 is a circuit diagram of one prior art treble control network;

FIG. 2*a* is a circuit diagram illustrating the principles of the treble control circuit of the present invention;

FIG. 2*b* is an equivalent explanatory circuit diagram derived from the circuit diagrams of FIG. 1 and FIG. 2*a*; and FIG. 3 is a circuit diagram of a complete tone control network incorporating the treble controller of the present invention.

Reference is now made to FIG. 1 of the drawings wherein the prior art treble control network is illustrated as comprising NPN transistor 11 having its base connected to source 12 of an audio frequency spectrum that is, for example, music or speech. The base of transistor 11 is biased into class A operation by resistor 13, connected between the base and the positive DC voltage at terminal 14. The DC supply voltage at terminal 14 is also connected to the collector of transistor 11 via load resistor 15. The emitter of transistor 11 is connected to ground through resistor 16 to provide regulating negative feedback bias control.

The amplified AC voltage at the collector of transistor 11 is fed to the prior art treble controller network 17. Network 17 comprises a voltage divider which includes series resistance 18 and a shunt circuit formed of variable resistance 19 and fixed capacitor 20. The AC voltage developed at the terminals between resistors 18 and 19 is fed to the input of voltage responsive amplifier 22.

Because of resistance 18, and its voltage dividing effect on the signal developed at the collector of transistor 11, there is significant attenuation of the voltage fed to amplifier 22 throughout the entire audio frequency spectrum of source 12, i.e. of the bass, mid-band and treble frequencies. Thereby, a significant portion of the voltage gain developed at the collector of transistor 11 is eliminated in treble control circuit 17 and, in some instances, the voltage applied to amplifier 22 is less than the original signal voltage of source 12. Of course, decreasing the voltage input to amplifier 22 has a deleterious effect on the signal-to-noise ratio of the entire amplifier, whereby the possibility of hum, transistor and microphonic noises is increased in the signal supplied by amplifier 22 to speaker 23.

According to the present invention, as illustrated by FIG. 2*a*, improved performance of the treble control network is attained by eliminating one of the components of the circuit in FIG. 1. The circuit of FIG. 2*a* relies upon the principle that the average voltage gain, $A_v$, of a common emitter transistor stage is approximately equal to the impedance ratio of the circuits connected to collector and emitter of the transistor, i.e. $A_v=R_L/R_E$, where $R_L$ is the impedance connected to the transistor collector and $R_E$ is the impedance connected to the transistor emitter. In the embodiment of the invention illustrated by FIG. 2*a*, all of the voltage developed at the collector of NPN transistor 11 is applied, without voltage division, to the treble control network comprising variable resistor 31 connected in series with capacitor 32.

As in the prior art circuit of FIG. 1, NPN transistor 29 has its base connected to an audio spectrum source 33, while class A bias is established by the connection of the base electrode through 10 megohm resistor 34 to the 25 volt DC source at terminal 35*a*. The DC voltage at terminal 35*a* is supplied to the collector of transistor 29 through load resistor 35, having a value of 15,000 ohms. The emitter of transistor 29 is connected to ground through 1000 ohm resistor 36 which provides DC bias stabilization.

Treble control circuit 37, connected between the collector of transistor 29 and ground, includes 200,000 ohm resistor 31, having a 10% logarithmic cut and 15 nanofarad capacitor 32. The voltage developed across treble control network 37 is fed to voltage responsive amplifier 38, the output of which feeds speaker 39.

The improved treble control network 37 of the present invention enables voltage gain to be derived from the collector of transistor 29 over the entire frequency range of the source 33, and does not cause the collector voltage to be reduced to any significant extent for the bass and mid-range frequencies. No reduction in the voltage developed at the collector of transistor 29 occurs for the bass and mid-range frequencies because voltage dividing resistor 18 of FIG. 1 has been excluded. Instead of relying upon voltage division for the treble control, the present invention relies upon the ratio of collector to emitter impedances, as discussed supra.

Turning now to a mathematical explanation of the difference between the circuits of my invention and those of the prior art, the approximate voltage gain of the common-emitter preamplifier stage for the treble control circuit 17 of FIG. 1 or the circuit 37 of FIG. 2*a* can be derived from the following equation:

$$A_v=\frac{e_c}{e_i}=\frac{\alpha R_L}{r_e+R_E+r_b(1-\alpha)} \qquad \text{Eq. No. 1}$$

Where:

$A_v$ is the approximate voltage gain.
$e_i$ is the A.C. voltage at source.
$e_c$ is the A.C. voltage at the collector terminal.
$r_b$ is the transistor base spreading resistance.
$r_e$ is the transistor emitter diffusion resistance.
$\alpha$ is the total forward current gain of $I_c/I_E$.
$I_c$ is current flowing into collector terminal.
$I_E$ is current flowing out of emitter terminal.
$R_E$ is the value of the emitter resistor.
$R_L$ is the value of the combined load impedance at the collector terminal.

Typical values:

$r_b$=500 ohms
$r_e$=30 ohms
$\alpha$=.975

If $R_E$ is made comparable to or greater than $r_b$ and much larger than $r_e$, and since $\alpha$ (alpha) is approximately equal to 1, Equation No. 1 can be reduced to:

$$A_v=e_c/e_i=R_L/R_E \qquad \text{Eq. No. 2}$$

Now that the relationship of the collector load $R_L$ to the emitter resistor $R_E$ has been established, a comparison of the circuitry in FIG. 1 to FIG. 2*a* can be shown by mathematically evaluating the effects of the treble control on the load impedance $R_L$.

Attention is directed to FIG. 2*b*, which represents an equivalent circuit diagram correlative to the circuits of both FIGS. 1 and 2*a*, for the purpose of explaining this mathematical aspect of my invention. In the equivalent circuit of FIG. 2*b*, the following values are represented:

$R_L$ is the collector load resistance.
$e_c$ is the voltage that appears at the collector of the preamplifier stage.
$R_S$ is series resistance.
$R_C$ is collector resistance.
$R_T$ is potentiometer resistance.
$C_T$ is the fixed capacitance in the treble circuit.
$e_o$ is the output voltage of the treble control circuit applied to the input of the amplifier.
$Z_P$ is the parallel impedance.
$R_A$ is the amplifier impedance.

In the prior art as well as in the proposed invention, the treble frequencies applied to the amplifier are at a minimum when the treble potentiometer is completely shorted out of the circuit. In the prior art circuitry, the following relationship would exist for treble frequency reduction by the voltage division of the series resistance and the fixed capacitance in the treble circuit arrangement.

$$e_o=e_c\frac{1/j\omega C_T}{R_S+1/j\omega C_T} \qquad \text{Eq. No. 3}$$

where:

$e_o$ is the output voltage of the treble control circuit 17 applied to the input of the amplifier 22.
$e_c$ is the voltage that appears at the collector of the preamplifier stage.
$R_S$ is series resistance.
$C_T$ is the fixed capacitance in the treble circuit 17.
$j$ equals the square root of $-1$.
$\omega$ is the frequency of source 12, in radians per second.

The parallel impedance $Z_P$ for such a circuit arrangement would normally equal:

$$Z_p=\frac{1}{1/R_A+j\omega C_T} \qquad \text{Eq. No. 4}$$

Since $R_A$, the impedance of the amplifier, can be considered large and $1/R_A$ considered small for the whole audio frequency spectrum when compared to $j\omega C_T$, Equation No. 4 would reduce to $1/j\omega C_T$ as shown in Equation No. 3.

The collector load impedance $R_L$ for the circuit of FIG. No. 1 then becomes:

$$R_L=\frac{R_C\times(R_S+1/j\omega C_T)}{R_C+(R_S+1/j\omega C_T)} \qquad \text{Eq. No. 5}$$

The effects of the capacitance reactance $1/j\omega C_T$ on the total collector impedance $R_L$ is minimized by the series resistance $R_S$ which is several times larger than the capacitive reactance. Therefore, in the prior art, the greatest treble frequency reduction is a result of the voltage division of $R_S$ and $C_T$ and very little reduction occurs due to $R_L$.

The collector load impedance $R_L$ for FIG. No. 2 becomes:

$$R_L=\frac{1}{1/R_C+j\omega C_T}$$

For treble frequencies, $j\omega C_T$ becomes much larger than $1/R_C$ and has a considerable effect on the value of $R_L$. When resistor $R_T$ is in the circuit, the treble frequencies applied to the amplifier are at their greatest amplitude.

Reference is now made to FIG. 3 of the drawings wherein the treble control network of the present invention is illustrated as being incorporated in a complete tone control network including base and loudness responses. The circuit of FIG. 3 is selectively responsive to the 100 millivolt output of tuner 41 or the 300 millivolt audio spectrum derived from piezoelectric ceramic phono pickup 42. Piezoelectric ceramic pick-up 42 includes internally thereof a series source capacity of .1 nanofarad, represented by capacitor 43. To reduce the 300 millivolt output of the ceramic pick-up 42 to a value commensurate with the output of tuner 41, two nanofarad capacitor 44 is connected between the output of the phono pick-up cartridge and ground, thereby providing a 3-to-1 voltage divider for the audio spectrum derived from the cartridge.

Selective coupling of the audio spectrums derived from tuner 41 and cartridge 42 to the preamplifier tone controller of the present invention is provided by double pole, single throw switch 45. The armature of switch 45 selectively engages contacts 46 and 47, responsive to the signals derived from tuner 41 and cartridge 42, respectively. The voltage at the armature of switch 45 is coupled to the base of NPN transistor 29. The biasing circuits for transistor 29 are specifically described and illustrated in conjunction with FIG. 2 and, accordingly, need not be reiterated.

The voltage developed at the collector of transistor 29 is fed to bass control circuit 51 that comprises series connected capacitors 52 and 53, having values of 10 microfarads and 0.01 microfarad respectively. The capacitors are sufficiently large so that they appear essentially as short circuits to the mid-band and treble frequencies derived from sources 41 and 42, i.e. frequencies of 400 cycles or above. The junction between capacitors 52 and 53 is connected to linear 200,000 ohm potentiometer 54, the slider of which is connected to the other electrode of capacitor 53. The remaining terminal of potentiometer 54 is connected to ground through fixed 33,000 ohm resistor 55. As the slider of potentiometer 54 is rotated to minimize the resistance between it and the terminal of the potentiometer connecting capacitors 52 and 53 together, the effect of capacitor 53 in the circuit is reduced. Hence, a greater bass response is derived by rotating the slider of potentiometer 54 towards a short circuit connection for capacitor 53.

Treble control circuit 37, as described in conjunction with FIG. 2*a*, is connected across the output of bass control network 51. In the actual embodiment of the invention (FIG. 3), variable resistor 31 (FIG. 2*a*) comprises a potentiometer 56 connected across the output of network 51 and having its slider 57 connected via terminal 57*a* to the terminal 56*a* of the potentiometer 56 and to the terminal of the slider of potentiometer 54. As slider 57 is rotated toward the terminal of potentiometer 56 which is connected to the slider, the value of resistor 31, FIG. 2*a*, is increased, whereby the treble response of the tone control network is increased. Rotating slider 57 in the opposite direction so that a greater amount of the potentiometer winding is short circuited reduces the value of resistor 31, and causes a decrease in the treble response appearing at the treble network output.

Physically, reducing the amount of potentiometer 56 effectively in the circuit is seen to decrease the treble frequency voltage at the collector of transistor 29.

The output voltage developed across treble control network 37 is applied to loudness control network 61. Loudness control circuit 61 includes potentiometer 62 having taps 63 and 64 thereon, as well as slider 65. The terminals of potentiometer 62 shunt the output of treble control circuit 37 and the voltage developed at slider 65 is applied to the input terminal of voltage responsive amplifier 66.

Voltage responsive network 66 has a relatively high input impedance, the base emitter impedance of a common emitter transistor, and is preferably an amplifier such as shown in the co-pending application of Adelore F. Petrie entitled "Audio Amplifier," GE Docket 38–3D–353, filed Jan. 3, 1966, bearing Ser. No. 518,061.

The remainder of loudness control network 61 comprises fixed frequency shaping networks to provide a matched frequency versus amplitude response for the speaker load connected to amplifier 66. In particular, loudness control network 61 includes two parallel branches 67 and 68 shunting the output terminals of treble control network 37. Branch 67 comprises the series combination of capacitors 69 and 70, as well as resistor 71. The junction between capacitors 69 and 70, is connected to tap 64, shunted to the high voltage output side of treble control network 37 through resistor 73. Branch 68 includes the series combination of capacitors 74 and 75, connected to resistor 76. The junction between capacitors 74 and 75 is connected to tap 63 on potentiometer 62.

As the slider of potentiometer 62 is rotated towards the terminal of the potentiometer which is connected to the high voltage output terminal of treble control network 37, the input voltage to amplifier 66 is increased, whereby the volume of audio signal derived from speaker 39, FIG. 2, becomes greater. With slider 65 at the top end of potentiometer 62, as illustrated in FIG. 3, the voltages for the treble and mid-band frequencies are applied to the input of amplifier 66 with zero attenuation. This is evident because at the frequencies mentioned, there is substantially zero impedance between the collector of transistor 29 and the input of amplifier 66. The deleterious effects of the prior art circuit wherein voltage division, even at the mid-band frequencies, is introduced by the treble control network are eliminated. With tre circuit illustrated in FIG. 3, the mid-band voltage gain of the preamplifier stage is on the order of 3, a value sufficiently great to obviate the adverse affects of hum and other noise on the output as derived from speaker 39.

While I have described and illustrated one specific embodiment of my invention, it will be clear that variations of the details of construction which are specifically illustrated and described may be made without departing from the true spirit and scope of the invention as defined in the appended claims.

What is claimed:

1. A tone control circuit comprising a source of audio frequency signals, a common emitter-transistor biased for Class A operation and having its bass electrode responsive to said source; a treble control network comprising a variable resistance series connected with a capacitor and shunting the collector electrode of said transistor, means for connecting said treble control network to said collector electrode so that substantially all of the voltage developed at said collector electrode at treble and mid-band frequencies of said source is applied across said variable resistance and said capacitor; an amplifier responsive to the voltage developed across said tone control circuit; means for varying the amplitude of the voltage applied to said amplifier; a speaker responsive to an output signal derived from said amplifier; and a bass control network shunting the collector electrode of said transistor and coupled to said treble control network for varying the amplitude of the signal applied to said amplifier, said bass control network including a pair of capacitors series connected between the collector electrode of said transistor and the input terminal of said amplifier, said capacitors having values such that their impedances are substantially zero to mid-band and treble frequencies of said source, and variable resistance means shunting one of said capacitors in said bass control network and shunting a connection between said capacitors.

2. The control circuit of claim 1 wherein said source of audio spectrum selectively comprises the output signal derived from a tuner or a phono cartridge, and means for selectively connecting one of said outputs to the base electrode of said transistor.

References Cited

UNITED STATES PATENTS

| | | |
|---|---|---|
| 2,133,816 | 10/1938 | Holst. |
| 2,433,330 | 12/1947 | Atkinson. |
| 2,547,251 | 4/1951 | Bonadio. |
| 2,626,991 | 1/1953 | Mountjoy et al. |

| | | |
|---|---|---|
| 3,130,374 | 4/1964 | Beres et al. |
| 3,421,117 | 1/1969 | Grout. |

KATHLEEN H. CLAFFY, Primary Examiner

C. JIRAUCH, Assistant Examiner

U.S. Cl. X.R.

333—28